US007064595B2

(12) United States Patent
Sharma et al.

(10) Patent No.: US 7,064,595 B2
(45) Date of Patent: Jun. 20, 2006

(54) DIFFERENTIAL INPUT RECEIVER

(75) Inventors: Manoj Kumar Sharma, New Delhi (IN); Sunil Chandra Kasanyal, Uttaranchal (IN); Rajesh Narwal, Haryana (IN)

(73) Assignee: STMicroelectronics PVT Ltd., Uttar Pradesh (IN)

( * ) Notice: Subject to any disclaimer, the term of this patent is extended or adjusted under 35 U.S.C. 154(b) by 5 days.

(21) Appl. No.: 11/018,275

(22) Filed: Dec. 21, 2004

(65) Prior Publication Data

US 2005/0184782 A1    Aug. 25, 2005

(30) Foreign Application Priority Data

Dec. 26, 2003  (IN)  ................................. 1620/2003

(51) Int. Cl.
*H03K 3/12*    (2006.01)

(52) U.S. Cl. ........................ 327/205; 327/206; 327/65

(58) Field of Classification Search .................. 327/65, 327/66, 67, 205, 206; 326/82, 83

See application file for complete search history.

(56) References Cited

U.S. PATENT DOCUMENTS

| | | | |
|---|---|---|---|
| 5,554,942 A * | 9/1996 | Herr et al. | 326/33 |
| 6,208,187 B1 * | 3/2001 | Callahan, Jr. | 327/206 |
| 6,879,198 B1 * | 4/2005 | Kumar et al. | 327/206 |
| 2005/0127970 A1 * | 6/2005 | Sharma et al. | 327/205 |

* cited by examiner

*Primary Examiner*—Quan Tra
*Assistant Examiner*—Khareem E. Almo
(74) *Attorney, Agent, or Firm*—Lisa K. Jorgenson; Allen, Dyer, Doppelt, Milbrath & Gilchrist, P.A.

(57) ABSTRACT

The differential input receiver provides constant symmetrical hysteresis over a wide input signal range. The differential input receiver includes a pair of complementary differential comparators having common input terminals, a pair of series connected complementary current mirrors each having source terminals driven by the output terminals of the corresponding differential comparator, a pair of transistors connected in series across each differential pair transistor in each differential comparator to form a potential divider across it, and a pair of series connected inverting buffers connected to a common output of the differential comparators to provide the final output. The individual buffer outputs are fed back to the control terminals of the series connected transistors in a manner that provides positive feedback thereby providing equal rise-time, fall-delay and transition times in the output signal.

13 Claims, 4 Drawing Sheets

DIFFERENTIAL INPUT RECEIVER

FIELD OF THE INVENTION

The present invention relates to the field of high speed differential signaling, and, more particularly, to a differential input receiver with hysteresis.

BACKGROUND OF THE INVENTION

Hysteresis characteristics are used in digital logic circuits to reduce/eliminate input noise to prevent false signals and glitches. A differential input receiver is essentially used for high-speed differential signaling. As the signaling speed is very high, the potential for noise induced interference is higher than for the normal case. Further differential IO standards generally require a low voltage input swing, e.g. for Low Voltage Differential Signals (LVDS) the minimum input voltage swing is 100 mV, as a result any small noise in the input can have a significant effect. For this reason, IEEE standard 1596.3-1996, for LVDS for Scalable Coherent Interface (SCI) recommends a minimum of 25 mV hysteresis in the LVDS receiver. Since LVDS signaling can operate over a wide range of input signals, it is necessary that the width of the hysteresis should be almost constant over that range.

FIG. 1 shows a differential input receiver in accordance with U.S. Pat. No. 6,275,073. This differential input circuit does not incorporate any hysteresis characteristics. The circuit can operate over a wide input range and can be used to support differential standards such as LVDS. The differential input circuit of FIG.1 includes a current mirror constant current source comprising a PMOS differential amplifier, and an NMOS differential amplifier. P_in and N_in are the two differential inputs to the circuits. PMOS transistors, Tr1 Tr2 and Tr3 and NMOS transistors, Tr9 and Tr10 constitute a PMOS differential amplifier while NMOS transistors Tr4, Tr5 and Tr6 and PMOS transistors Tr7 and Tr8 constitute an NMOS differential amplifier.

Transistors Tr2, Tr3, Tr5 and Tr6 are input transistors as their gates are connected to the input signals P_in and N_in. The source of transistors Tr2 and Tr3 are connected to the drain of transistor Tr1 whose gate is connected to VSS and source to VDD. VDD and VSS are the lower power supply terminals. The drain terminals of transistors Tr2 and Tr3 are connected to the drains of transistors Tr9 and Tr10 respectively. The source terminals of transistors Tr9 and Tr10 are connected together to the VSS. The gates of transistors Tr9 and Tr10 are connected to the drain of input transistor Tr2. The source terminals of transistors Tr5 and Tr6 are connected together to the drain of transistors Tr4, which has its gate connected to VDD while its source is connected to VSS. The drains of transistors Tr5 and Tr6 are connected to the drains of transistors Tr7 and Tr8 respectively whose source terminals are connected to VDD. The gates of transistors Tr7 and Tr8 are connected to the drain of input transistor Tr5. A resistance R is connected between the drains of transistors Tr2 and Tr5 while the drain terminals of transistors Tr3 and Tr6 are connected together to the output terminal Out.

The operation of the differential input receiver of FIG.1 can be understood as follows. When P_in is greater than N_in i.e. P_in>N_in, the output Out is HIGH. On other hand when P_in is less than N_in (P_in<N_in), Out is LOW. In this manner, the differential input receiver acts as a comparator and the switching point of the circuit is the crossover point of the two differential inputs. If there is noise in any of the input signals that results in the crossing of two inputs, the output can switch to a false state. This is significant because the differential input receiver normally works at high frequencies where the potential noise influence is much greater. The output characteristics of this circuit are shown in FIG. 3 by the curve OUT_prior.

FIG. 1A shows the another prior art input receiver for Gunning Transceiver Logic (GTL) standard which is shown in U.S. Pat. No. 5,666,068 titled GTL Input Receiver With Hysteresis. This input receiver incorporates hysteresis to support GTL standard. This circuit is basically a PMOS differential amplifier where Vin1 and Vin2 are the two inputs and OUT is the output. PMOS P3 and PMOS P4 are the input transistors which are connected to the inputs. P8 and P9 transistors connected in parallel with P3 and P4 respectively are used to provide hysteresis. This circuit supports GTL standard only and can not be used to support LVDS standard.

Therefore, it has been observed that there is a need to develop an input receiver that incorporates hysteresis properties to eliminate the influence of noise signals while operating with low voltage swing and wide range of inputs.

SUMMARY OF THE INVENTION

An object of the present invention is to obviate the above drawbacks. To achieve the objective this invention provides a differential input receiver providing constant symmetrical hysteresis over a wide input signal range, including a pair of complementary differential comparison means having common input terminals, a pair of complementary current source means each having its current supply/sink terminals driven by the output terminals of the corresponding differential comparison means, a switched controlled resistance connected across each comparison element in each differential comparison means having its control terminal connected to the input of its corresponding comparison element, and a pair of series connected inverting buffers connected to a terminal common to the output of the differential comparison means to provide the final output, the individual buffer outputs being fed back to the switch terminals of the switched resistance in a manner that provides positive feedback, thereby providing equal rise-time, fall-delay and transition times in the output signal.

The differential comparison means is a differential comparator. The switched resistance is a transistor.

The present invention also provides a method for improving a differential input receiver to provide constant symmetrical hysteresis over a wide input signal range, comprising connecting together the common input terminals of a pair of complementary differential comparators, attaching the current supply/sink terminals of a pair of series connected complementary current sources to the first output terminals of the corresponding differential comparator, connecting a switched controlled resistance across each differential pair transistor in each differential comparator having its control terminal connected to the output terminal of its corresponding differential pair transistor, and connecting a pair of series connected inverting buffers to a terminal common to the second output of the differential comparators to provide the final output, the individual buffer outputs being fed back to the switch terminals of said controlled resistance in a manner that provides positive feedback, thereby providing equal rise-time, fall-delay and transition times in the output signal.

BRIEF DESCRIPTION OF THE DRAWINGS

The invention will now be described with reference to the accompanying drawings.

DETAILED DESCRIPTION OF THE PREFERRED EMBODIMENTS

Figure 1:
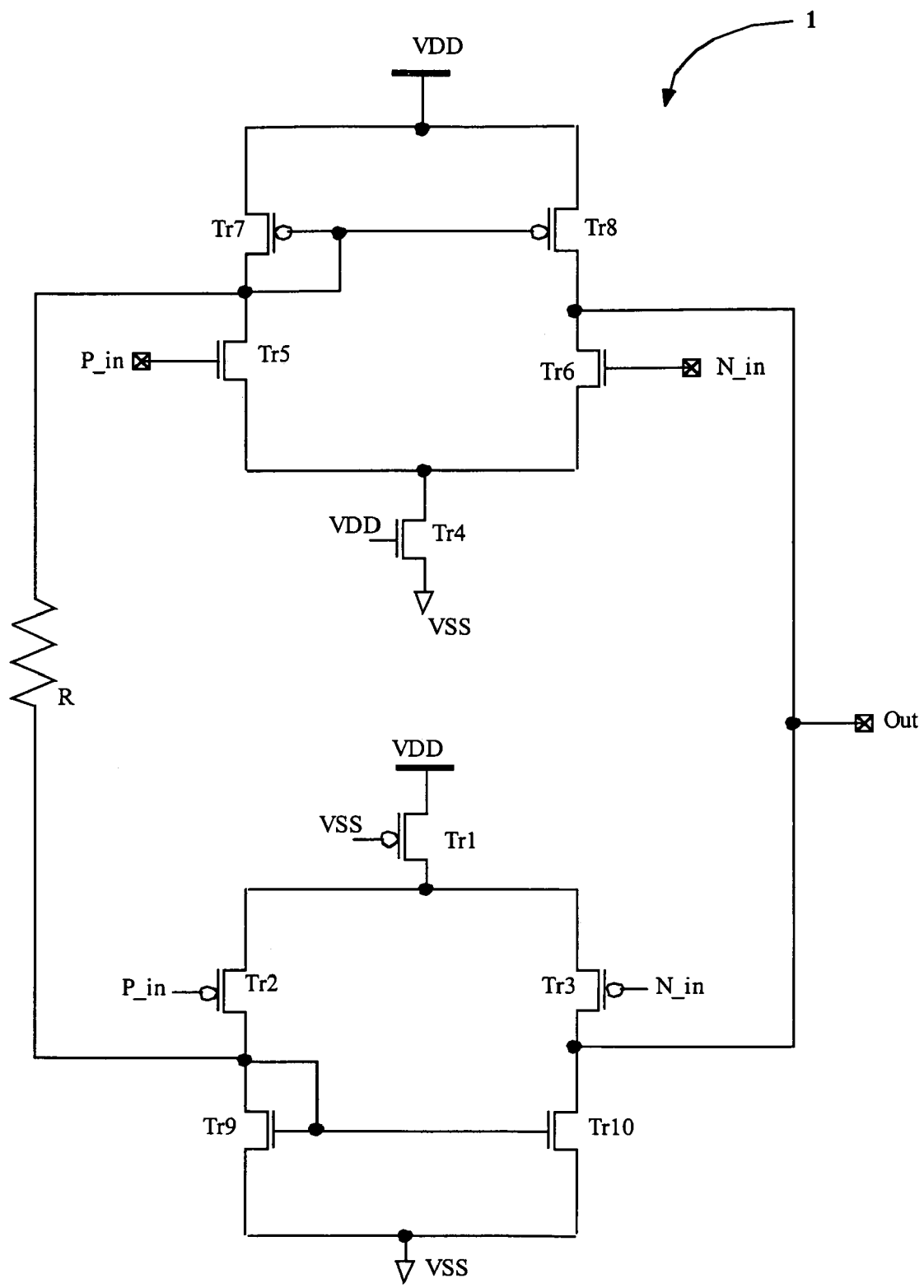
FIG. 1 shows a differential input receiver in accordance with the U.S. Pat. No. 6,275,073.
Figure 1A:
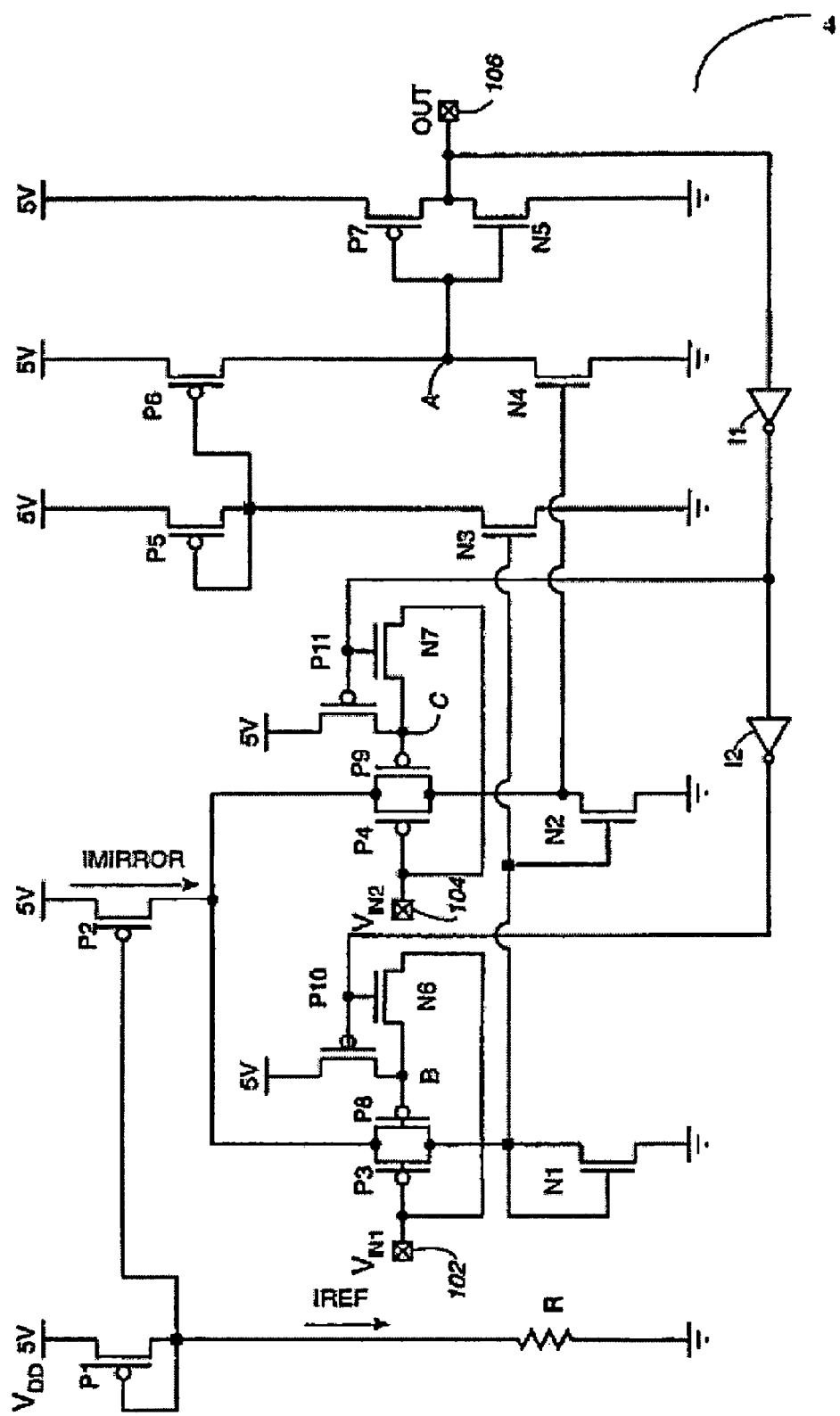
FIG. 1A shows the prior art differential input receiver of patent, U.S. Pat. No. 5,666,068.
Figure 2:
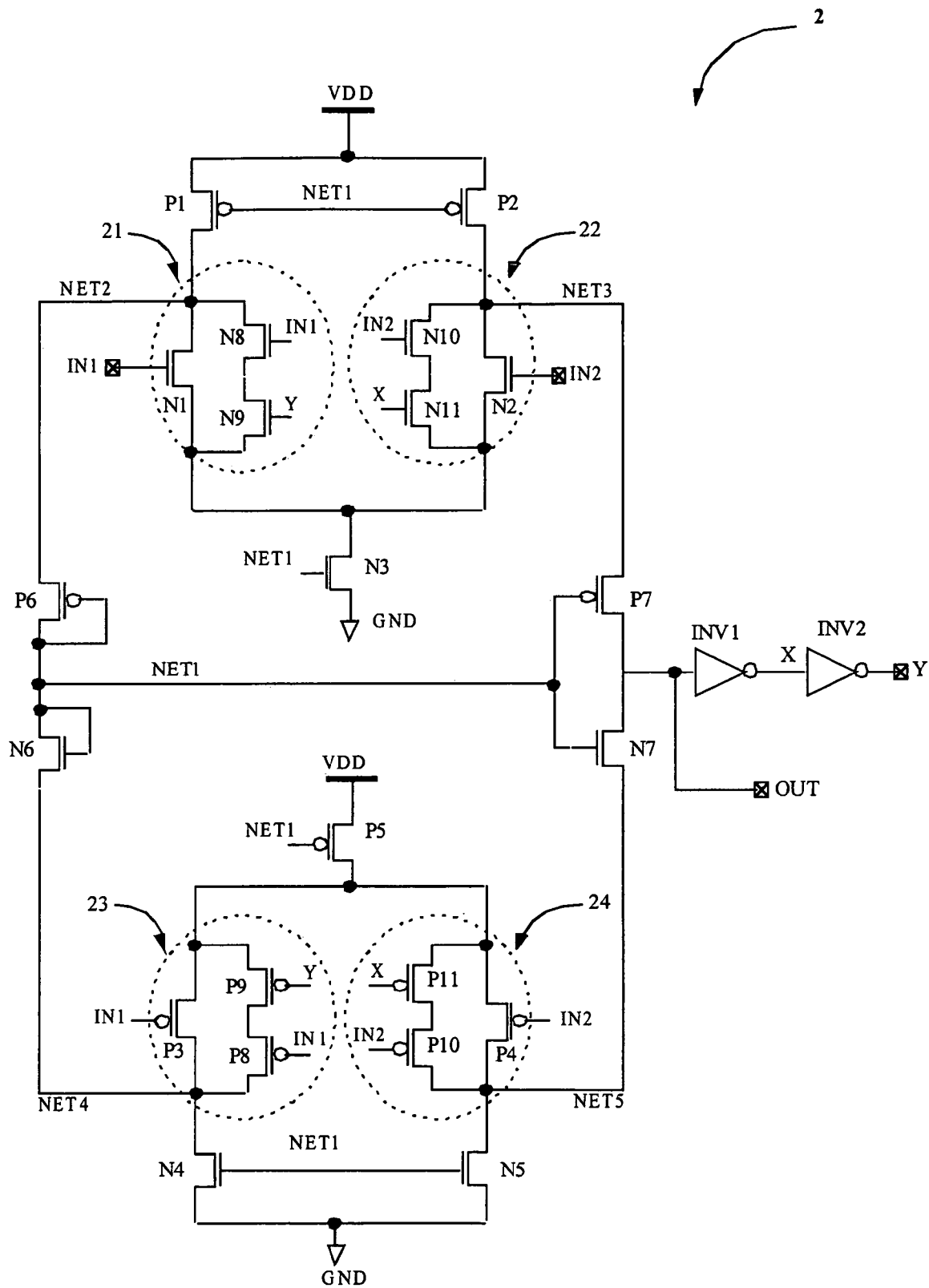
FIG. 2 shows a first embodiment in accordance with the present invention.

A preferred embodiment of the present invention will be described with reference to FIG. 2. The differential input receiver includes an NMOS differential amplifier and a PMOS differential amplifier. The NMOS differential amplifier includes NMOS transistors N1, N2 and N3 and PMOS transistors P1 and P2. The transistors N1 and N2 are the input transistors since their gates are connected to the two differential inputs IN1 and IN2 respectively. The source terminals of transistors N1 and N2 are connected together to the drain of transistor N3. The gate of transistor N3 is connected to NET1 while its source is connected to ground.

Transistors N3 with P6 and N6 together act as a current source circuit that sinks the desired amount of current in the NMOS differential amplifier. The drains of transistors N1 and N2 are connected to the drains of transistors P1 and P2 respectively. The source terminals of transistors P1 and P2 are connected to the supply VDD while their gates are connected to NET1. The PMOS differential amplifier includes PMOS transistors P3, P4, P5 and NMOS transistors N4 and N5. P3 and P4 are the input transistors as their gates are connected to the inputs IN1 and IN2 respectively. The source terminals of P3 and P4 are connected to the drain of P5. The gate of P5 is connected to NET1 while its source is connected to VDD. The drain terminals of P3 and P4 are connected to the drains of N4 and N5 respectively.

Transistors N4 and N5 have their source terminals connected together to the ground voltage while their gates are also connected together to NET1. P5 with P6 and N6 forms a current source circuit and sources the desired amount of current in the PMOS differential amplifier. P6 and N6 have their gates and drains shorted together to NET1. The source of P6 is connected to NET2 which is the drain of N1 while the source of N6 is connected to NET4 which is the drain of P3. P7 and N7 form an inverter in which their gates are connected to NET1 while the source of P7 is connected to NET3 which is the drain terminal of N2 and the source of N7 is connected to NET5 which is the drain of P4. The drain terminals of transistors P7 and N7 is the OUT terminal of the receiver. Inverters INV1 and INV2 form a buffer circuit, where Y and X are respectively the true and complement value of the output of the receiver.

The transistors from N8 to N11 and from P8 to P11 are used to provide hysteresis in the receiver. In the NMOS differential amplifier, transistors N8 and N9 are connected in the series with each other and in parallel with transistor N1 while N10 is in series with transistor N11 and they are in parallel with transistor N2. The gates of transistors N8 and N9 are connected to the input IN1 and true value of the output Y respectively. On other hand, the gate of transistor N10 is connected to the other input IN2 while the gate of transistor N11 is connected to the complement value of the output X. Transistors N1, N8 and N9 form a branch 21 while transistors N2, N10 and N11 form branch 22.

In the PMOS differential amplifier, transistors P8 and P9 are in series with each other and this combination is in parallel with input transistor P3. The gates of P8 and P9 are connected to IN1 and Y respectively. Transistors P10 and P11 are in series with each other and are in parallel with transistor P4. The gates of transistors P10 and P11 are connected to IN2 and X respectively. Transistors P3, P8 and P9 form branch 23 and transistors P4, P10 and P11 form branch 24.

The operation of the circuit can be understood as follows.

Case 1: LOW to HIGH Transition

Initially IN1<IN2 and OUT=LOW so X=1 and Y=0. In this case, for NMOS differential amplifier, transistor N9 is OFF, cutting off the current path to transistor N8. Also transistor N11 is ON, hence transistor N10 is in parallel with transistor N2. As IN1 is less than IN2, the resistance of N2 is less than N1. As transistor N10 is in parallel with transistor N2, the effective resistance of branch 22 becomes much smaller than that of branch 21. As a result, the current through branch 22 is much greater than the current through branch 21. Now if IN1 increases and IN2 decreases, the resistance of N1 decreases and resistance of N2 increases. When IN1 and are equal IN2, the resistance of transistors N1 and N2 are equal but still X=1 and Y=0, this keeps transistor N10 in parallel with N2 and N8 is cut off, so the effective resistance of branch 22 is still less than branch 21. On further increase in IN1, say IN1 is just less than $VT_H$ (IN1~$VT_H$), the resistance of branch 21 becomes equal to the resistance of branch 22, the current through the two branches become equal and any slight increase in IN1 (say IN1=$VT_H$), makes output OUT, HIGH as at this point the current through branch 21 is greater than the current through branch 22. This makes X=0 and Y=1. This causes transistor N9 ON and transistor N11 OFF. This makes transistor N8 in parallel with transistor N1 while transistor N10 becomes ineffective. This further decreases the resistance of branch 21 and increases the resistance of branch 22 thereby further increasing the current through branch 21.

The PMOS differential amplifier of differential input receiver operates similarly. For IN1<IN2 or even IN1=IN2, the effective resistance of branch 23 is less than that of branch 24. So current through branch 23 is greater than that thru branch 24. Only when IN1=$VT_H$, the effective resistance of branch 23 becomes greater than that of branch 24. At this moment the current through branch 23 becomes less than the current through branch 24, and OUT goes HIGH. This makes X=0 and Y=1 which makes P9 OFF and P11 ON. This will further increase the current through branch 24 as compared to the current through branch 23.

Hence a LOW to HIGH transition at the output takes place only when IN1=$VT_H$ or greater.

Case 2: HIGH to LOW Transition

Assuming, IN1>IN2 initially and OUT=HIGH. So X=0 and Y=1. As IN1>IN2, in NMOS differential amplifier the resistance of transistor N1 is less than that of transistor N2. Moreover as Y=1 and X=0, which makes transistor N9 ON and transistor N11 OFF, so that transistor N8 comes in parallel with transistor N1 while transistor N10's path is cut off. So the effective resistance of branch 21 is much less than that of branch 22. Hence the current through branch 21 is greater than that in branch 22 which keeps OUT at HIGH, X=0 and Y=1.

If IN1 decreases and IN2 increases, the resistance of transistor N1 increases while that of transistor N2 decreases. But still X=0 and Y=1, which holds transistor N9 ON and transistor N11 OFF. This keeps transistor N8 in parallel with transistor N1 while transistor N10's path is cut off. So the effective resistance of branch 21 is still less than that of branch 22 and current through branch 21 is still greater than branch 22.

On further decrement in IN1, e.g. IN1 becomes just less than $VT_L$ (i.e. IN1~$VT_L$), the effective resistance of branch 21 becomes equal to that of branch 22 and an equal amount of current flows through both the paths. Any further increase in IN1, e.g. at IN=$VT_L$, the resistance of transistor N1 is further increased and become greater than that of transistor N2 such that the effective resistance of branch 21 becomes greater than that of path 22. So the current through path 22 becomes greater than the current through path 21 which makes OUT LOW and X=1 and Y=0. This results in transistor N9 OFF and transistor N11 ON. Now transistor N10 comes in parallel with transistor N2 while transistor N8's path is cut off. This will further increase the effective resistance of 21 and decreases the effective resistance of 22. This further increases the current through 21, and keeps OUT at LOW state.

Similarly in the case of the PMOS differential amplifier when IN1 is greater than IN2, and OUT=HIGH, X=0 and Y=1, transistor P9 is OFF while transistor P11 is ON. This makes transistor P10 come in parallel with transistor P4 while transistor P8's path is cut off. So the effective resistance of branch 23 is much greater than that of branch 24 which results in increased current flow through 24 as compared to 23. Hence output OUT remains HIGH and therefore X=0 and Y=1. Only when IN1 is reduced to $VT_L$ i.e. IN1=$VT_L$, the effective resistance of 23 becomes less than that of 24 and the current through 23 becomes greater than that in 24. At this point, output OUT become LOW, X=1 and Y=0. Hence a HIGH to LOW output transition takes place only when IN1=$VT_L$ or less.

The PMOS transistor P6 and NMOS transistor N6 form a potential divider while transistors P7 and N7 form an inverter. The trip point of this inverter should be adjusted such that it can detect whatever small variation occurs on NET1. When IN1>IN2 and IN1 is greater than or equal to $VT_H$, the voltage at NET2 is reduced while the voltage at NET3 is increased. Also for this case, the voltage at NET4 is reduced while that at NET5 is increased. For the potential divider formed by transistors P6 and N6, hence the voltage at NET2 and NET4 is decreased, the voltage at NET1 is reduced. Also, since the gate voltage for the inverter formed by transistors P7 and N7 at NET1 is reduced while the voltage at NET3 and NET5 is increased the inverter gives a HIGH output i.e. OUT become HIGH.

For the other case, i.e. IN1<IN2 and IN1 is less than or equal to $VT_L$, the voltage at NET2 and NET4 is increased while the voltage at NET3 and NET5 is decreased. This results in an increase in the voltage at NET1 which is the potential divider's output. As NET1 is increased and NET3 and NET5 are reduced, the output of the inverter formed by transistors P7 and N7 gives a LOW output i.e. OUT is LOW, X=1 and Y=0.

The inverters INV1 and INV2 are used to improve the swing of the differential amplifier and restore the logic levels. The INV1 and INV2 provide the complement value of the output X and true value of the output Y respectively.

As explained above, the differential input receiver of present invention has two different trip points for two different transition i.e. $VT_H$ for LOW to HIGH transition and $VT_L$ for HIGH to LOW transition, so a noise of width $VT_H$-$VT_L$ can be eliminated. Hence it provides improved noise immunity.

Figure 3:
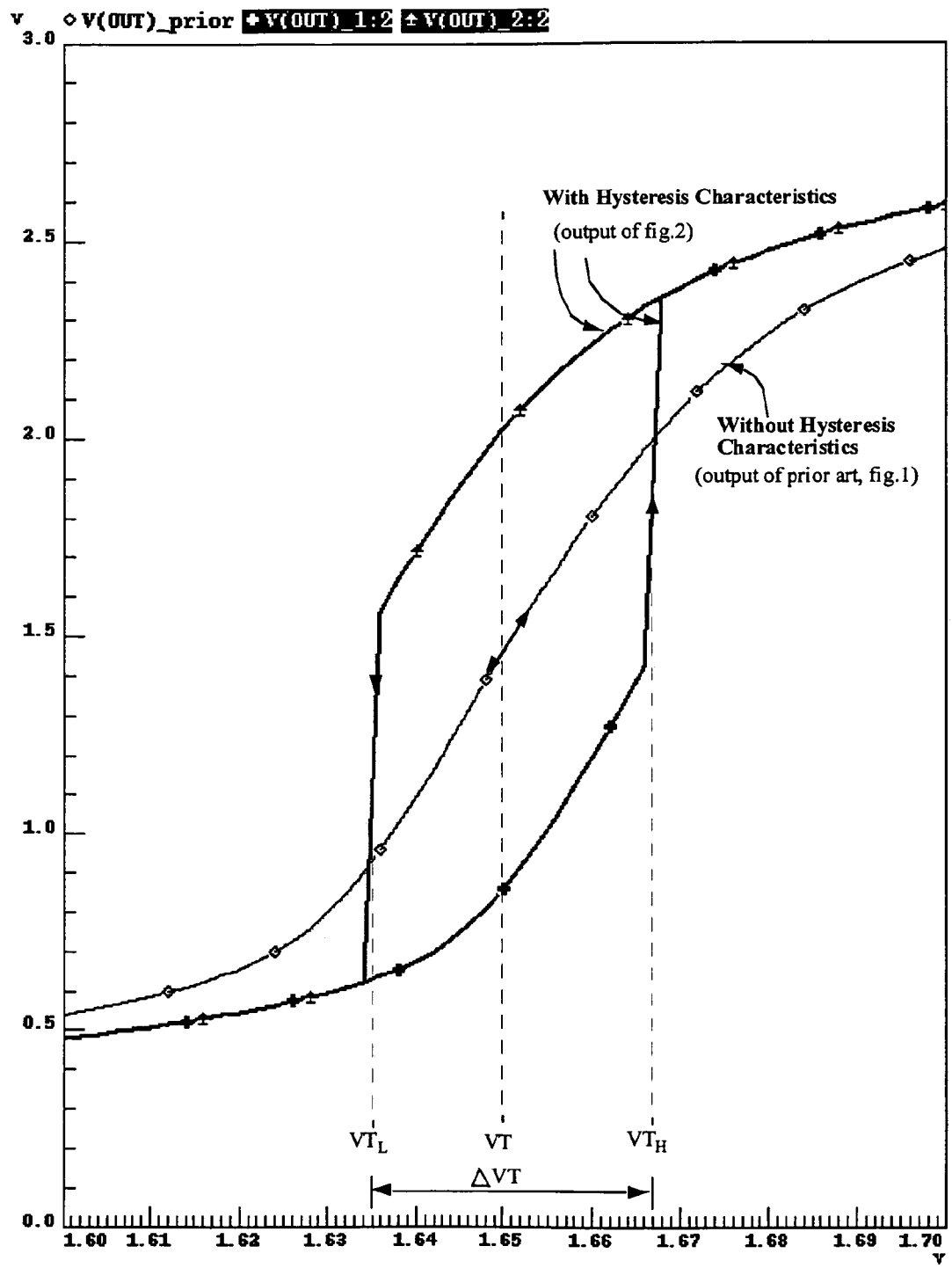
FIG. 3 shows the output characteristics of the input receivers according to the present invention and prior art of FIG. 1.

FIG. 3 shows the simulation results. It is clear from the graph that the present invention provides an input receiver with hysteresis as compared to the prior art receiver. The differential input receiver of the prior art has only one trip point VT for both HIGH to LOW and LOW to HIGH transitions. VT is basically the crossing point of two inputs signals. Whereas the input receiver according to the present invention provides two trip or switching points, $VT_H$ for LOW to HIGH transition and $VT_L$ for HIGH to LOW transition. This means that the receiver makes a LOW to HIGH transition only when inputs cross at $VT_H$ and HIGH to LOW transition when inputs crosses each other at $VT_L$. Hence a noise of width $VT_H$-$VT_L$ can be eliminated.

Thus it is clear that the present invention provides an improved differential input receiver with hysteresis that can operate at low input voltage and over a wide range of input swings. Moreover the different embodiments provide hysteresis characteristics such that the width of hysteresis is almost constant for a wide range of input signal. This makes it possible for the differential input receiver of the present invention to support various differential IO standards e.g. LVDS, LVPECL, HSTL etc. with improved noise margin.

That which is claimed is:

1. A differential input receiver comprising:
   a pair of complementary differential comparison devices, each comprising a plurality of comparison elements, and having common input terminals;
   a pair of complementary current source devices each having current supply/sink terminals driven by first output terminals of the corresponding differential comparison devices;
   a switched controlled resistance connected across each comparison element in each differential comparison device having a control terminal connected to an input of the corresponding comparison element; and
   a pair of series connected inverting buffers connected to a terminal common to a second output of the differential comparison devices to provide the receiver output, respective buffer outputs being fed back to switch terminals of the switched resistance.

2. A differential input receiver as claimed in claim 1 wherein respective buffer outputs are fed back to switch terminals of the switched resistance in a manner that provides positive feedback thereby providing equal rise-time, fall-delay and transition times in the receiver output signal.

3. A differential input receiver as claimed in claim 1 wherein constant symmetrical hysteresis is provided over a wide input signal range.

4. A differential input receiver as claimed in claim 1 wherein each of the differential comparison devices comprises a differential comparator.

5. A differential input receiver as claimed in claim 1 wherein the switched resistance comprises a transistor.

6. A differential input receiver providing constant symmetrical hysteresis over a wide input signal range, and comprising:
   a pair of complementary differential comparison devices, each comprising a plurality of comparison elements, and having common input terminals;
   a pair of complementary current sources each having current supply/sink terminals driven by first output terminals of the corresponding differential comparison devices;

a switched controlled resistance connected across each comparison element in each differential comparison device having a control terminal connected to an input of the corresponding comparison element; and a pair of series connected inverting buffers connected to a terminal common to a second output of the differential comparison devices to provide the receiver output, respective buffer outputs being fed back to switch terminals of the switched resistance in a manner that provides positive feedback thereby providing equal rise-time, fall-delay and transition times in the receiver output signal.

7. A differential input receiver as claimed in claim 6 wherein each of the differential comparison devices comprises a differential comparator.

8. A differential input receiver as claimed in claim 6 wherein the switched controlled resistance comprises a transistor.

9. A method of operating a differential input receiver comprising:

connecting together input terminals of a pair of complementary differential comparators each comprising a pair of transistors;

connecting current supply/sink terminals of a pair of series connected complementary current mirrors to output terminals of the corresponding differential comparator;

connecting a switched controlled resistance across each differential pair transistor in each differential comparator, the switched controlled resistance having a control terminal connected to an first output terminal of the corresponding differential pair transistor; and connecting a pair of series connected inverting buffers to a terminal common to the second output of the differential comparators to provide the receiver output, the individual buffer outputs being fed back to switch terminals of the controlled resistance in a manner that provides positive feedback thereby providing equal rise-time, fall-delay and transition times in the output signal.

10. A method as claimed in claim 9, wherein constant symmetrical hysteresis is provided over a wide input signal range.

11. A method of making a differential input receiver comprising:

connecting together input terminals of a pair of complementary differential comparators each comprising a pair of transistors;

connecting current supply/sink terminals of a pair of series connected complementary current sources to first output terminals of the corresponding differential comparator;

connecting a switched controlled resistance across each differential pair transistor in each differential comparator, the switched controlled resistance having a control terminal connected to an output terminal of the corresponding differential pair transistor; and connecting a pair of series connected inverting buffers to a terminal common to the second output of the differential comparators to provide the receiver output, the individual buffer outputs being fed back to switch terminals of the controlled resistance.

12. A method as claimed in claim 11, wherein the individual buffer outputs are fed back to the switch terminals of the controlled resistance in a manner that provides positive feedback thereby providing equal rise-time, fall-delay and transition times in the output signal.

13. A method as claimed in claim 11, wherein constant symmetrical hysteresis is provided over a wide input signal range.

* * * * *

UNITED STATES PATENT AND TRADEMARK OFFICE
CERTIFICATE OF CORRECTION

PATENT NO.         : 7,064,595 B2
APPLICATION NO. : 11/018275
DATED                  : June 20, 2006
INVENTOR(S)       : Sharma et al.

It is certified that error appears in the above-identified patent and that said Letters Patent is hereby corrected as shown below:

| | |
|---|---|
| Column 1, Line 36 | Delete: "Tr1 Tr2 and Tr3"<br>Insert: -- Tr1, Tr2 and Tr3 -- |
| Column 1, Line 62 | Delete: "On other"<br>Insert: -- On the other -- |
| Column 2, Line 6 | Delete: "the another"<br>Insert: -- another -- |
| Column 4, Line 27 | Delete "are equal IN2,"<br>Insert: --IN2 are equal, -- |
| Column 5, Line 14 | Delete: "become"<br>Insert: -- becomes -- |
| Column 5, Line 36 | Delete: "become"<br>Insert: -- becomes -- |
| Column 5, Line 66 | Delete: "present"<br>Insert: -- the present -- |
| Column 6, Line 15 | Delete: "crosses"<br>Insert: -- cross -- |
| Column 6, Line 22 | Delete: "signal"<br>Insert: -- signals -- |
| Column 7, Line 25 | Delete: "mirrors"<br>Insert: -- sources -- |

UNITED STATES PATENT AND TRADEMARK OFFICE
CERTIFICATE OF CORRECTION

PATENT NO.        : 7,064,595 B2
APPLICATION NO.   : 11/018275
DATED             : June 20, 2006
INVENTOR(S)       : Sharma et al.

It is certified that error appears in the above-identified patent and that said Letters Patent is hereby corrected as shown below:

Column 7, Line 31    Delete: "an first"
                     Insert: -- a first --

Signed and Sealed this

Thirty-first Day of July, 2007

JON W. DUDAS
*Director of the United States Patent and Trademark Office*